(12) United States Patent
Sorensen

(10) Patent No.: US 6,291,986 B1
(45) Date of Patent: *Sep. 18, 2001

(54) INSERT FOR MEASURING CURRENT IN CONDUCTORS WITHIN AN ELECTRICAL ENCLOSURE

(76) Inventor: Sheldon J. Sorensen, 9120 County Road 140, Cologne, MN (US) 55322

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/334,016

(22) Filed: Jun. 15, 1999

(51) Int. Cl.[7] .............. G01R 1/04; G01R 1/06; G01R 19/00
(52) U.S. Cl. .......... 324/156; 324/129; 324/107; 324/149; 324/127
(58) Field of Search .................. 324/127, 115, 324/156, 149, 107, 129

(56) References Cited

U.S. PATENT DOCUMENTS

| | | | |
|---|---|---|---|
| 1,101,210 | * | 6/1914 | Potter et al. |
| 3,753,049 | * | 8/1973 | Plummer ............ 317/107 |
| 4,001,804 | * | 1/1977 | Irving ............ 340/255 |
| 4,004,221 | * | 1/1977 | Wilson ............ 324/158 |
| 4,616,177 | * | 10/1986 | McClain et al. ............ 324/156 |
| 5,072,848 | * | 12/1991 | Pipis et al. ............ 220/241 |

OTHER PUBLICATIONS

*Amprobe's Catalog—Clamp–Ons*, 1–2, (1996).*
*LEM Instruments—Clamp–On Instruments*, 1–3, (1999).*
"Product Feature: The ACD–10 Ultra/ACD–10 TRMS", *Amprobe Catalog Items*, 1–3, (1996).*

* cited by examiner

Primary Examiner—Glenn W. Brown
Assistant Examiner—Wasseem H. Hamdan
(74) Attorney, Agent, or Firm—Schwegman, Lundberg, Woessner & Kluth, P.A.

(57) ABSTRACT

A conduit apparatus for an electrical enclosure that allows safe, convenient access for current measurement of circuits therein is provided. The conduit apparatus has one or more non-magnetic conduits extending therethrough. The conduits, in turn, each house a conductor. The conduits are accessible from outside the enclosure. By placing a hook-on type ammeter over the conduit, the current in the conductor may be measured. In one embodiment, the conduit apparatus is a component that mounts within a load center or other electrical enclosure. In another embodiment, the conduit apparatus is an integral portion of such an enclosure.

20 Claims, 7 Drawing Sheets

INSERT FOR MEASURING CURRENT IN CONDUCTORS WITHIN AN ELECTRICAL ENCLOSURE

TECHNICAL FIELD

This invention relates generally to current measurement and, more particularly, to an apparatus that provides convenient access for current measurement of conductors within an electrical enclosure.

BACKGROUND OF THE INVENTION

Electrical enclosures that house circuitry for receiving and distributing electrical power and for otherwise housing various electrical components are well known. For example, in residential and industrial settings, electrical enclosures are used as load centers (e.g., fuse boxes) or electrical disconnects to distribute power from a central power distribution transformer to one or more circuits. These enclosures house fuses, circuit breakers, ground fault interrupters, and other electrical components. In industrial environments, electrical enclosures are used not only for power distribution, but also to house equipment-specific electronics such as fuses, relays, transformers, motor controllers, logic circuitry, power supplies and the like. In general, most any piece of industrial equipment will include a separate enclosure that receives facility power and distributes it in accordance with equipment demands. While the present invention is applicable to most any electrical enclosure, for the sake of brevity it will be discussed with reference to these equipment-specific enclosures.

Electrical enclosures generally comprise a box having an open side or face providing access to the enclosure interior. Mounted within the box are various electrical components as already mentioned above. Electricity is provided to the box by one or more conductors, distributed to the various electrical components therein, and ultimately routed to the specific circuits/conductors that supply the equipment.

During use, the open side of the enclosure is partially or completely covered by a cover panel or door. The panel prevents contact between foreign objects (hands, tools, etc.) and the electrical components within the box. To further protect personnel from potential electrical shock, the panel is designed to prohibit casual opening. That is, it is typically fastened or secured to restrict unauthorized access.

With industrial equipment, it is often necessary to measure the load or current drawn by specific equipment (or specific circuits within the equipment). In fact, facility maintenance personnel often measure current draw of various machines on a periodic basis to determine the operational status or to predict potential problems before they occur. For example, an electric motor will often exhibit a gradual increase or decrease in current draw as the driven equipment wears. By monitoring the current load, technicians can anticipate motor and equipment life and schedule replacement prior to failure. In addition to routine maintenance, current measurement is also used to diagnose malfunctioning equipment.

Of the various devices used to measure electrical current, the hook-on or clamp-on ammeter probably enjoys the most widespread use. Hook-on ammeters of the type having a hook-shaped magnetic core probe that hooks around a current-carrying wire, cable, or conduit are well known. The magnetic core probe of the ammeter reacts with the magnetic field generated by the current flowing through the wire. Since the intensity of the magnetic field is directly proportional to the current, the ammeter may be calibrated to provide an accurate current reading. Hook-on ammeters are often preferred over other current measuring methods as they are simple to use and do not require breaking the wire casing or otherwise contacting the conductor. Nonetheless, hook-on ammeters do require access to the individual conductor.

Unfortunately, in order to access the current-carrying conductors, it is generally necessary to gain access to the enclosure. The same cover panel which was beneficial in preventing unauthorized access to the enclosure now becomes a impediment. Depending on the number of enclosures in a given facility and the frequency with which current measurements are taken, the time spent removing and reinstalling enclosure cover panels can be substantial.

In addition to the time burden of removing the panel, other problems exist. For example, removing the panel may require momentarily shutting down the equipment. This can introduce significant delays in equipment usage depending on the start-up procedure required thereafter. Furthermore, to test current draw, the equipment must be operating. That is, the enclosure is "live" during testing such that the technician is exposed to high voltage conductors. Because of the potential danger involved in dealing with high voltage systems, local or facility regulations may limit enclosure access to licensed electricians.

Still yet another problem experienced by technicians is the isolation of the particular conductor to be measured. Industrial enclosures typically have numerous conductors and, even when the desired conductor is clearly labeled, it must be adequately isolated or separated from the others to permit coupling of the hook-on ammeter.

Accordingly, what is needed is an apparatus for use with an electrical enclosure that permits quick, efficient current measurement of one or more circuits within the enclosure without actually requiring entry therein.

SUMMARY OF THE INVENTION

A conduit apparatus for measuring electrical current is provided herein. In one embodiment, the apparatus comprises a conduit enclosure having at least one open side and one or more non-magnetic conduits extending through a portion of the enclosure. The conduits are accessible through the open side and each conduit is adapted to receive a single electrical conductor.

A method of measuring the current in a conductor contained within an electrical enclosure is also provided. In one embodiment the method comprises providing an electrical enclosure having a box with a series of walls defining an interior. The box further includes at least one electrical conductor therein. The electrical enclosure also has a conduit apparatus having at least one non-magnetic conduit accessible from outside the box wherein the conduit is adapted to receive the electrical conductor therein. The conduit apparatus additionally comprises a conduit enclosure having one or more surfaces which isolate the conduit from the interior of the box. The method further includes attaching a hook-on ammeter to the conduit and measuring the current with the ammeter.

An electrical enclosure is also provided. In one embodiment, the enclosure comprises a box having a series of walls defining an interior and having one side that defines an opening wherein the box is adapted to receive one or more electrical conductors. The enclosure further includes: a panel which selectively covers the opening; and a conduit apparatus. The conduit apparatus has at least one non-magnetic conduit accessible from outside the box wherein the conduit is adapted to receive the electrical conductor therein. The conduit apparatus also includes a conduit enclosure having one or more surfaces which isolate the conduit from the interior of the box.

Advantageously, the present invention provides an apparatus for use with an electrical enclosure which provides convenient access for current measurement of circuits within the enclosure. In particular, the apparatus provides adequate access for a hook-on ammeter without requiring entry into the enclosure itself. Any number of independent conductors may be measured simply by providing a corresponding conduit through which the conductor passes. Because entry into the enclosure is not required, the time required to complete the current measuring process is minimized. Furthermore, risk of electrical shock is also reduced as external measurement reduces or eliminates exposure to high voltage components.

BRIEF DESCRIPTION OF THE DRAWINGS

The invention described herein will be further characterized with reference to the drawings, wherein.

DETAILED DESCRIPTION OF THE EMBODIMENTS

In the following detailed description of the embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Generally speaking, the invention is directed to an apparatus for use with an electrical enclosure to provide safe, convenient current measurement of conductors within the enclosure via a hook-on ammeter. This access is provided without requiring entry into the enclosure. Since the current can be measured without penetrating the enclosure, the time required to complete the measurement process is substantially reduced. Furthermore, because the enclosure remains sealed, the technician's exposure to electrical shock is likewise reduced.

Figure 1:
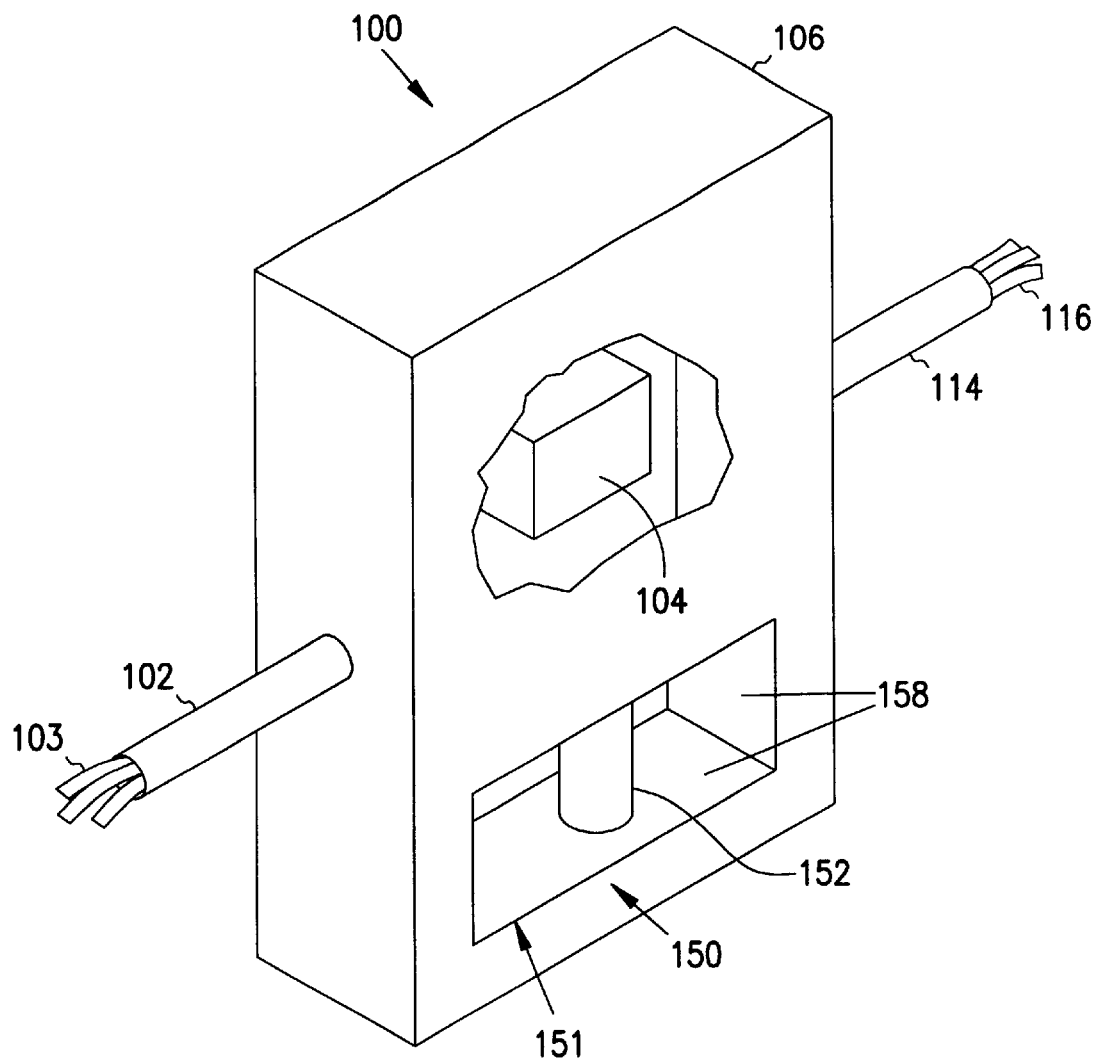
FIG. 1 is a diagrammatic perspective view of a generic electrical enclosure incorporating a conduit apparatus in accordance with one embodiment the present invention.

Referring now to FIG. 1, a generic electrical enclosure 100 is shown. AC or DC electrical current is supplied to the enclosure 100 by one or more primary conduits 102 having one or more primary conductors 103. The enclosure 100 includes various electrical components 104 such as fuse elements, logic circuits, relays, transformers, motor controllers and the like enclosed within a box 106, the box being defined by a series of walls. A conduit apparatus 150 is also located in the enclosure. The conduit apparatus 150 includes one or more conduits 152 which are accessible from outside the enclosure 100. Passing through the conduit 152 is a single conductor. In one embodiment, the conductor passing through the conduit 152 is a primary conductor 103. In another embodiment, the conductor enclosed by the conduit 152 is a branch conductor 116 of a branch circuit 114. The branch circuit 114 delivers current to a particular component outside the enclosure 100. It is noted that while other conductors (e.g., neutral, ground) are necessary to complete the circuits described herein, these other conductors are, for the most part, not necessary to an understanding of the instant invention. Accordingly, they have been excluded from the following description except where necessary to clarify the invention. However, those skilled in the art will realize that these other conductors (e.g., neutral, ground) may also be routed through separate conduit(s) 152 if desired.

Figure 2:
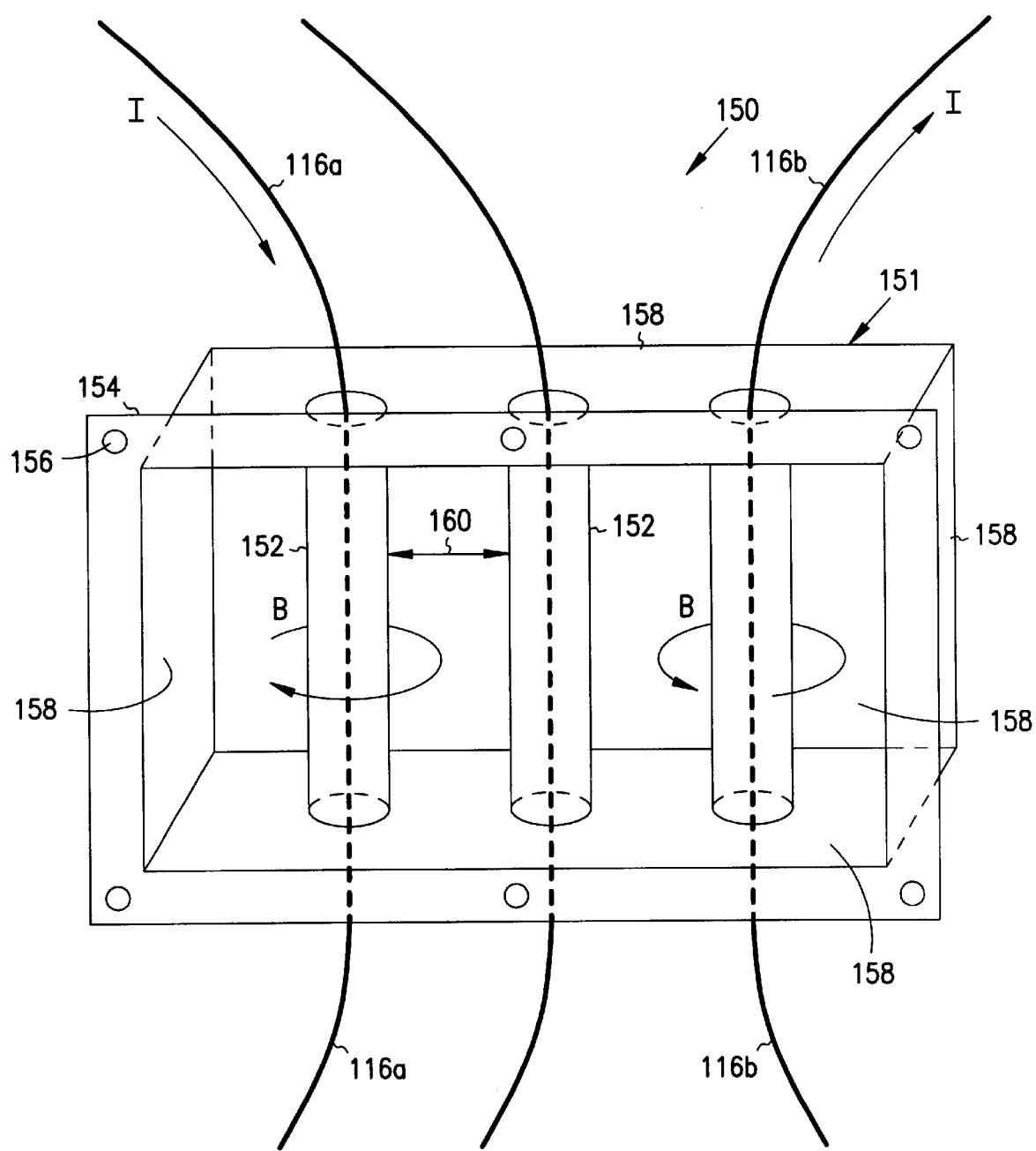
FIG. 2 is a perspective view of the conduit apparatus in accordance with another embodiment of the invention.

While shown with only one conduit 152, other embodiments of the apparatus 150 may include any number of conduits. For example, FIG. 2 shows another embodiment of the conduit apparatus comprising three conduits 152. In addition to the conduits 152, the apparatus 150 also comprises an open-sided, box-like structure or conduit enclosure 151 through which the conduits 152 extend. The conduit enclosure 151 has a plurality of surfaces or walls 158 surrounding the conduits. The apparatus also includes, in one embodiment, a flange 154 having mounting holes 156 for receiving fasteners so that the apparatus 150 may be secured to the enclosure 100. While fasteners are shown, other mounting means (e.g., rivets, welds, adhesives, or other conventional attachment devices and methods) are also possible within the scope of the invention. When the apparatus is coupled to the enclosure 100, the surfaces 158 cooperate to prevent access to the enclosure 100 interior (see FIG. 1).

The apparatus 150 may be a separate component (as shown in FIG. 2) or, alternatively, may be integral to the enclosure 100. The number of conduits 152 may be varied depending on the number of conductors for which current measurement is desired. For example, in embodiments utilizing three-phase power, additional conduits 152 are provided to accommodate the additional conductors. When the apparatus 150 is installed (as shown in FIG. 1), a single conductor 116 is routed through each conduit 152 as shown in FIG. 2. The conductor 116 then, in one embodiment, exits the enclosure to form part of a branch circuit external to the enclosure. If desired, both a "hot" conductor (e.g., 116a in FIG. 2) and a "neutral" conductor (e.g., 116b) from the same circuit may be routed through separate conduits 152. By measuring and comparing the current through conductors 116a and 116b, current leaks may be detected.

Figure 3:
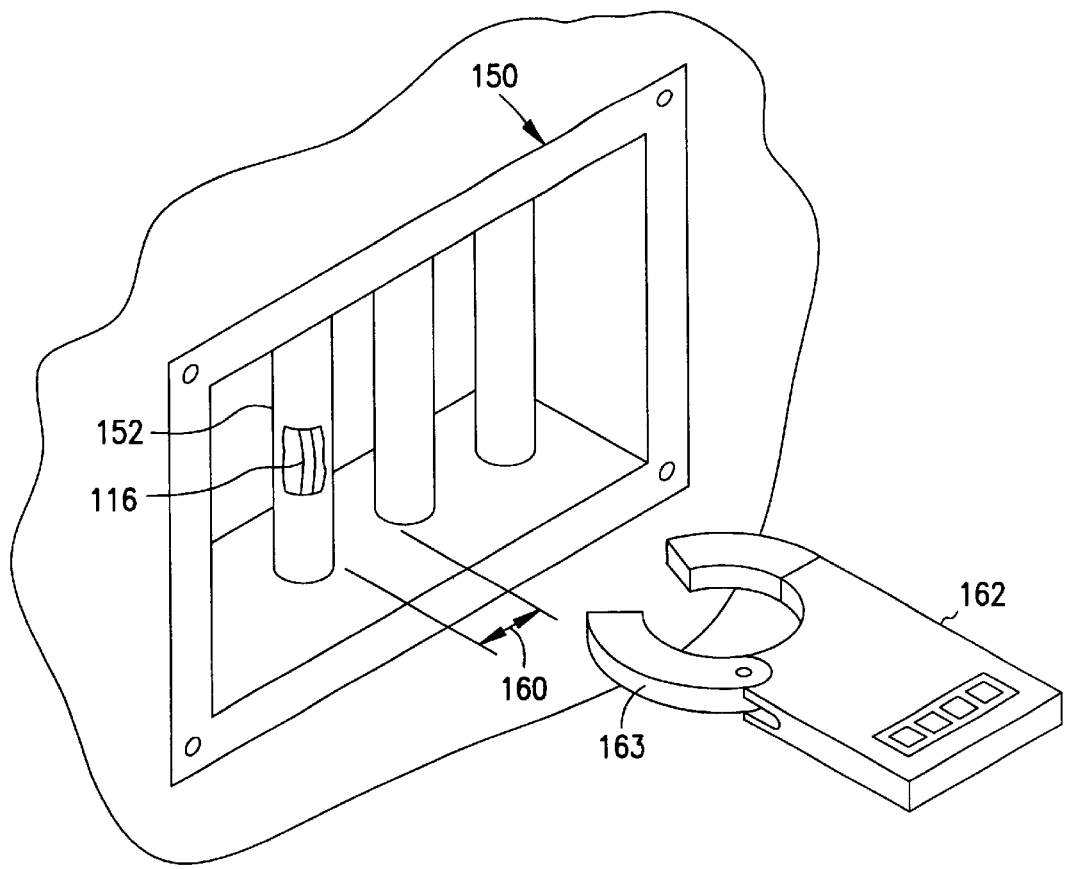
FIG. 3 is a perspective view illustrating a method of measuring current with a hook-on ammeter in accordance with one embodiment of the invention.

Referring now to FIG. 3, the conduits 152 are separated by a distance 160 sufficient to permit a hook-on ammeter 162 to be coupled to each individual conduit. The ammeter 162 has a jaw apparatus 163 which is biased to the closed position, thus forming a ring. When opened (as shown in FIG. 3) the jaws separate to permit the ammeter to be "hooked" to a conductor or conduit such as 152. The ammeter relies on the magnetic field (represented by "B" in FIG. 2) generated by the current (represented by "I" in FIG. 2) flowing through the conductor. That is, the ammeter indicates the running current in the conductor 116 by measuring the magnetic field created around the conduit 152.

In order to avoid interference with the magnetic field B, the conduits 152 are, in one embodiment, made of a non-magnetic material such as stainless steel, aluminum, or plastic. While metal offers improved rigidity and durability, plastic offers protection against shock should a short occur within the conduits. In another embodiment, the entire apparatus 150 is made of a non-magnetic material. The conduit enclosure 151 and conduits 152 may be formed as an integral unit or constructed from separate components.

While the present invention may be used with virtually any enclosure in which current measurement may occasionally or regularly be required, Applicant perceives that one advantageous use of the present invention is in conjunction with dedicated equipment enclosures (e.g., junction boxes, disconnects, instrumentation enclosures). These enclosures are typically provided with most large industrial equipment including, for example, hydraulic pumps, electric motors, machining equipment, environmental equipment (e.g., industrial ovens, temperature chambers), and HVAC systems to name a few. Generally, these enclosures provide a selectable main disconnect to isolate the equipment from main power. Furthermore, they include any number of electrical components including fuses, breakers, relays, motor controllers, transformers, logic and control circuitry, power supplies and the like. These enclosures may feed numerous circuits supplying various subsystems on the respective equipment.

Figure 4:
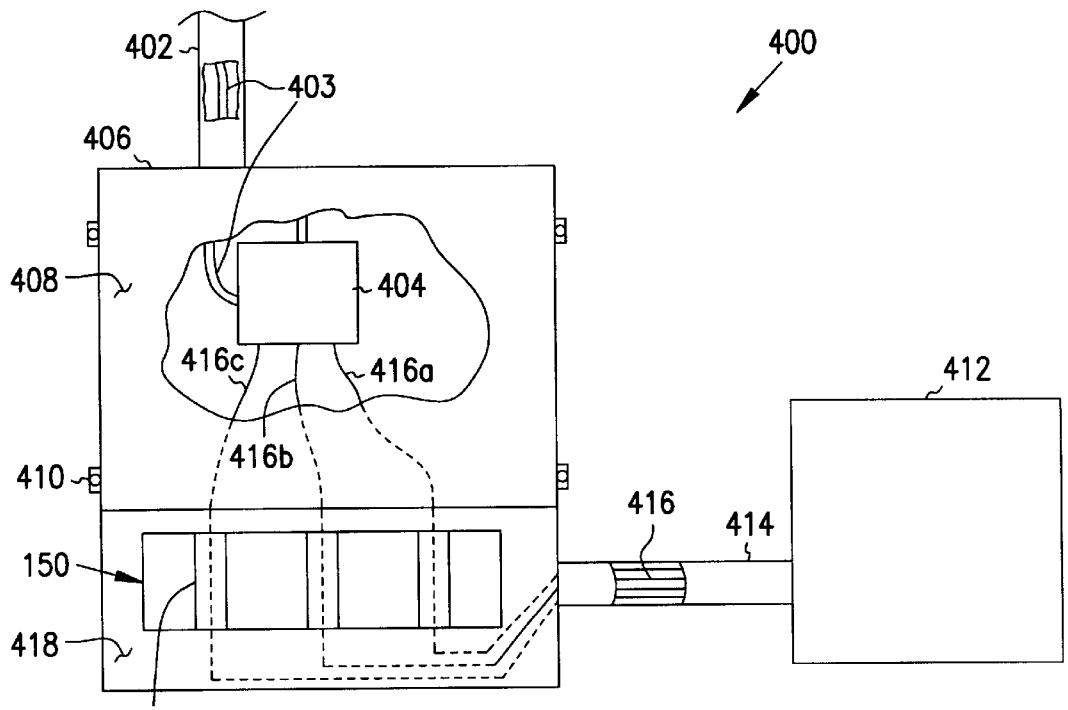
FIG. 4 is a diagrammatic view of the conduit apparatus as used in an industrial enclosure in accordance with another embodiment of the invention.

Referring now to FIG. 4, an exemplary embodiment of an industrial electrical enclosure 400 is illustrated. The enclosure 400 receives electrical power through a conduit 402 housing one or more primary conductors 403. The conductors 403 feeds a bus or electrical panel (not shown) which provides power to various electrical components diagrammatically represented by 404 in FIG. 4. Like the enclosure 100, the enclosure 400 comprises a box 406 having a series of walls and an open side. The box 406 typically includes a door or cover panel 408 which selectively covers the open side of the box 406 to form the enclosure 400. The panel 408 is secured to the box via fastener latches 410 which are generally known in the art.

The enclosure provides power to equipment 412 via one or more conduits 414 which contain various conductors. A plurality of "hot" conductors 416 are separated from the other conductors in their respective circuits and routed through the conduit apparatus 150 as previously described with reference to FIG. 2. The conduit apparatus includes one conduit for each conductor 416. The individual conductors 416 form part of separate circuits each of which provide power to a different subsystem or component of the equipment 412. For example, one circuit having a first conductor 416a may power a starter while another circuit having a second conductor 416b powers a primary motor while still yet another circuit having yet a third conductor 416c powers a secondary motor. While shown as having three conduits in FIG. 4, embodiments having any number of conduits are also within the scope of the invention.

The conduit apparatus 150, in one embodiment, is disposed in an area of the enclosure that is not covered by the panel 408 so that it remains accessible at all times. Accordingly, a technician may approach the enclosure 400 with a hook-on ammeter 162 (see FIG. 3) and quickly check the current in any or all of the accessible circuits.

By providing external access for current measurement, the conduit apparatus of the present invention eliminates the need to remove the panel 408 before each measurement. In addition to saving valuable time normally expended in removing the panel, the use of an enclosure incorporating the conduit apparatus also reduces the possibility of electrical shock inherent with open enclosures.

The particular location of the conduit apparatus can be altered to accommodate the particular application. In the embodiment shown in FIG. 4, the apparatus is attached to an extended portion 418 of the enclosure 400 which is not covered by the panel 408. While the apparatus 150 is, in one embodiment, integrally formed with the enclosure 400 it may alternatively be a separate component (similar to that shown in FIG. 2) which is inserted and secured into an aperture (not shown) in the extended portion 418.

Figure 5:
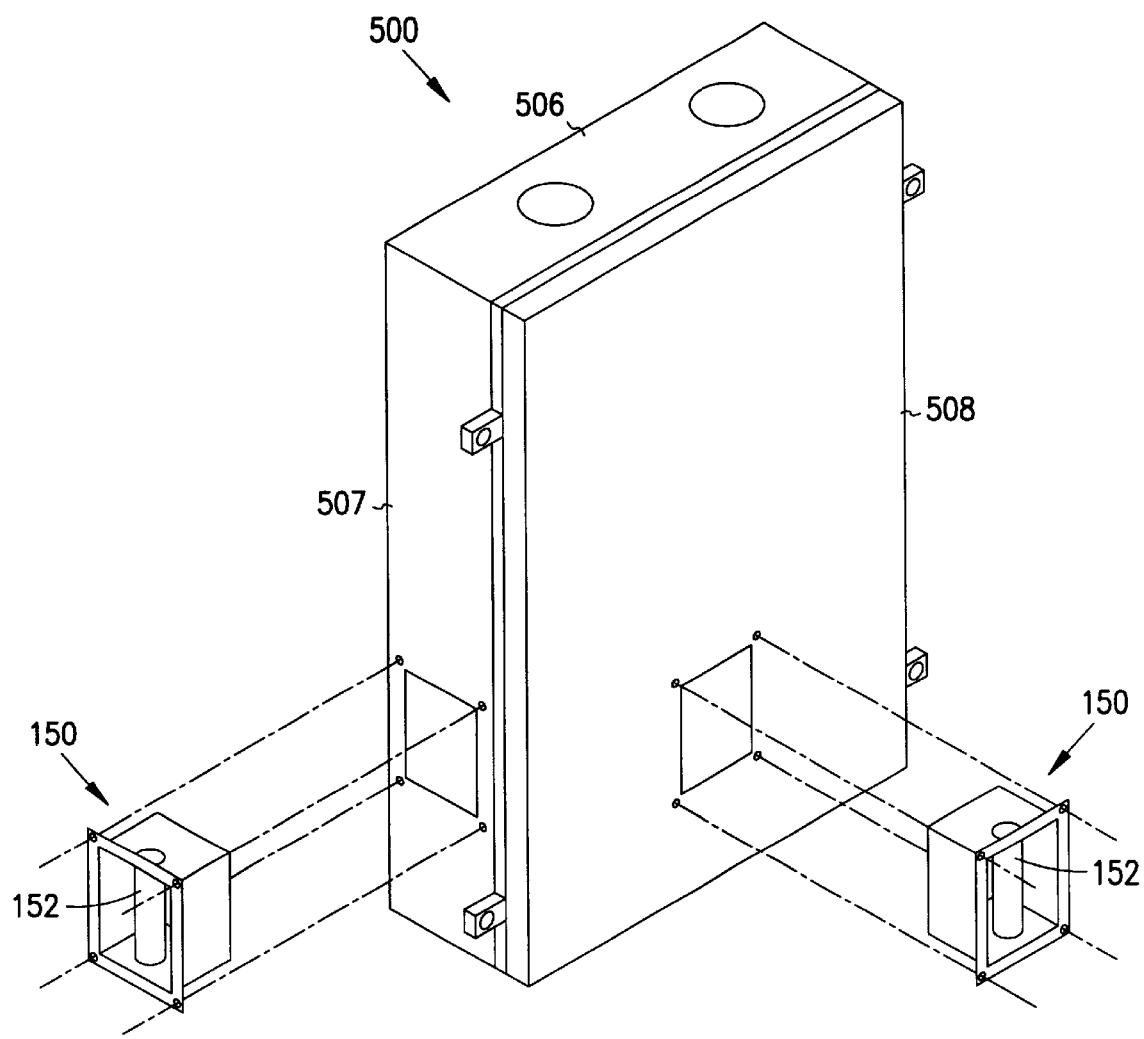
FIG. 5 is an exploded perspective view of a conduit apparatus as used in an industrial enclosure in accordance with yet another embodiment of the invention.

Another embodiment of the present invention is shown in FIG. 5. Here, a conventional enclosure 500 having a full cover panel 508 is shown wherein the apparatus 150 is mounted into an aperture in a side wall 507 of the box 506. In still yet another embodiment, the conduit apparatus 150 is alternatively or additionally inserted into an aperture provided in the panel 508 itself. Accordingly, numerous embodiments are possible without departing from the scope of the invention. The particular embodiments described herein are thus considered illustrative only and are not intended to limit the scope of the invention in any way.

Yet another application for which Applicant perceives the present invention is particularly useful is load centers. Load centers are found in commercial, industrial, and residential settings and generally house electrical components such as fuse elements (e.g., fuses, circuit breakers). In an exemplary load center, main AC power is provided to the enclosure by two primary conductors (each typically having a phase offset from the other) and distributed to a plurality of fuse elements. The fuse elements then distribute the electricity to remote locations via branch circuits.

Figure 6:
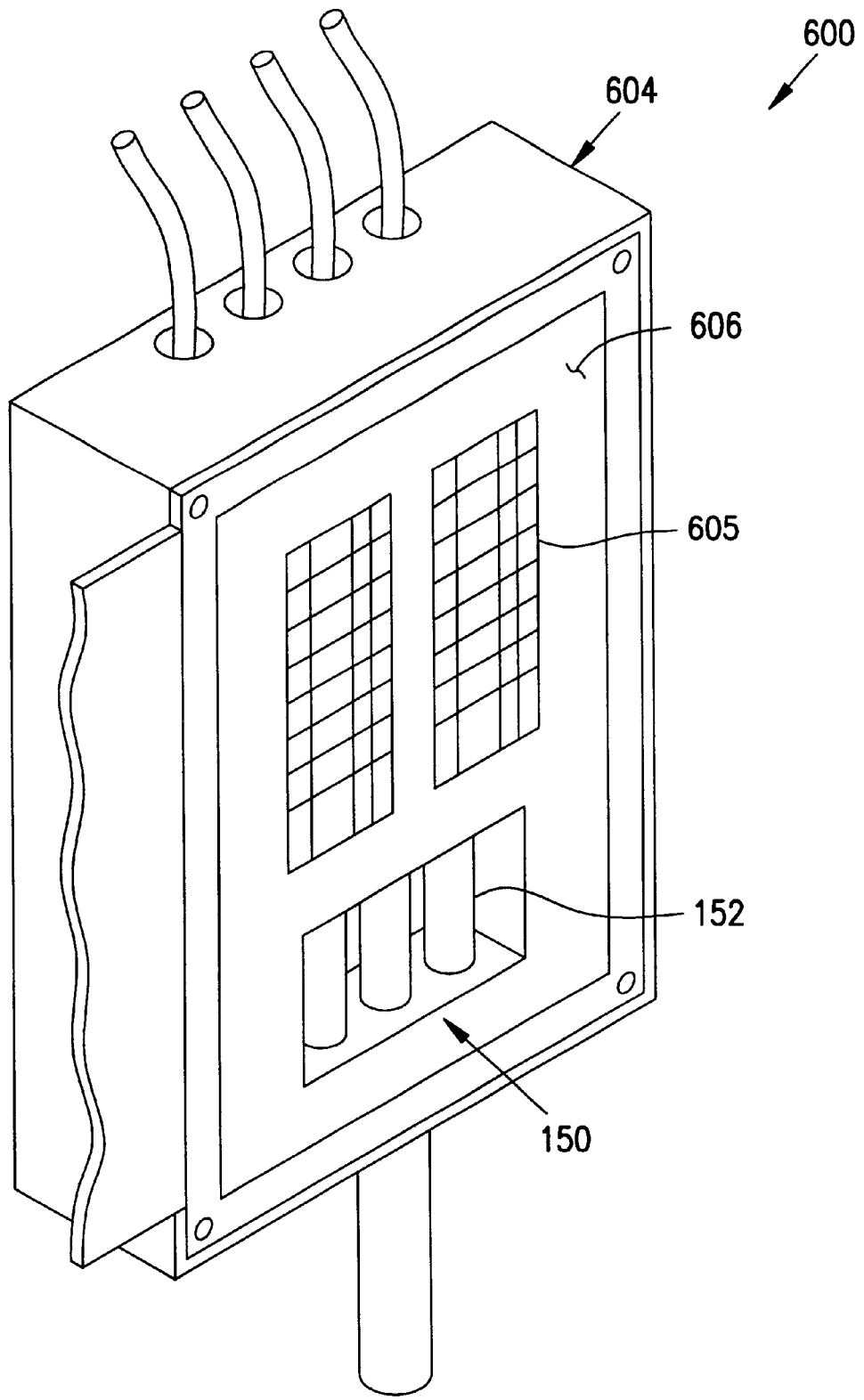
FIG. 6 is a perspective view of a conduit apparatus as used in a load center enclosure in accordance with yet another embodiment of the invention.

Referring now to FIG. 6, a load center enclosure 600 is shown. In one embodiment, the enclosure 600 includes a box 604 and a trim panel or cover 606. The trim panel 606 provides access to the electrical components 605 and one or more conduits 152 as further described below.

Figure 7:
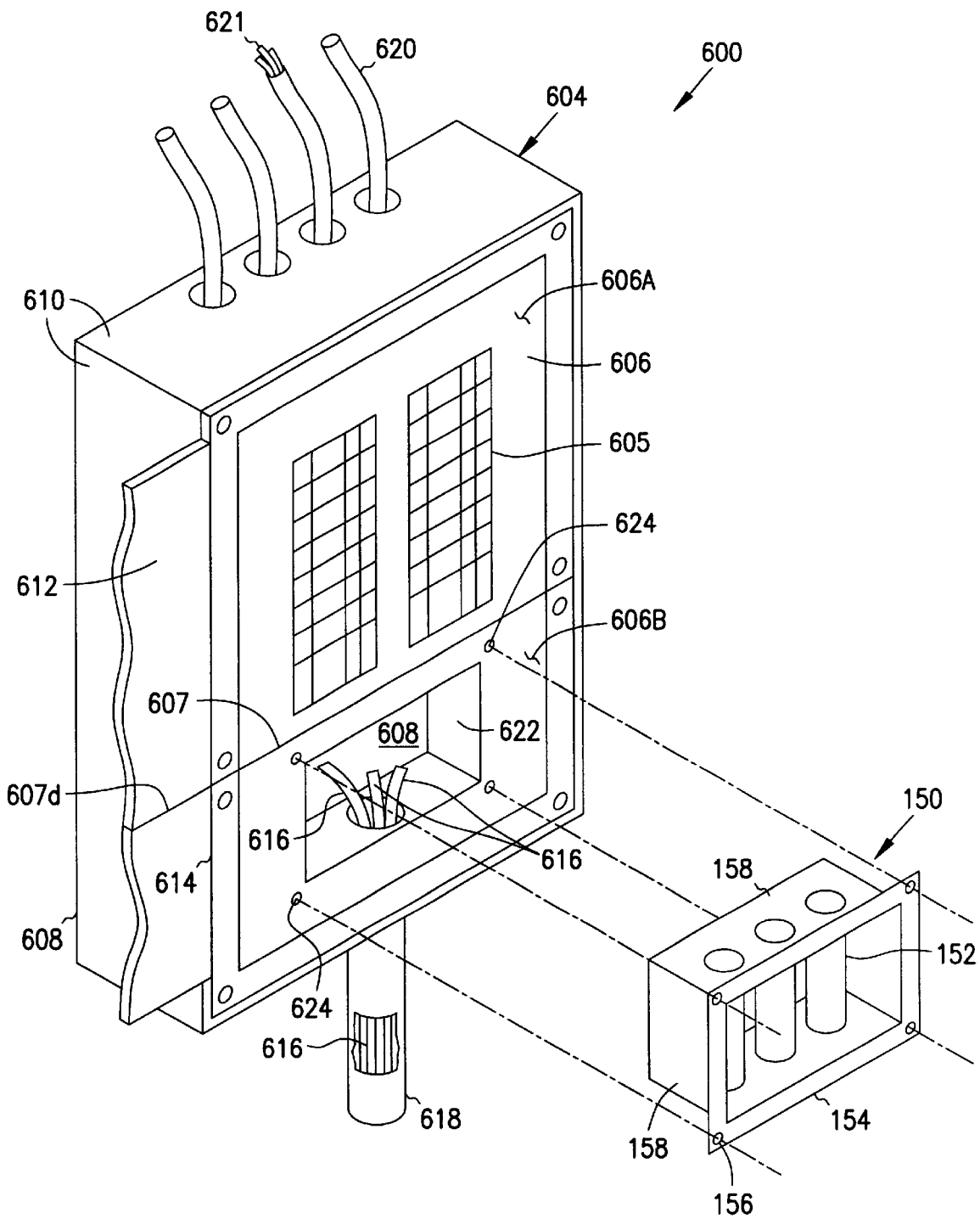
FIG. 7 is an exploded perspective view of an electrical enclosure showing a conduit apparatus in accordance with another embodiment of the invention.

Referring now to FIG. 7, the box 604 supports an electrical panel (not shown) which, in turn, supports the electrical components 605. The electrical components are, in one embodiment, fuse elements such as circuit breakers 605. The box typically has a back wall 608, a plurality of side walls 610, and an open face which receives the trim panel 606. The back wall 608 (or side walls 610) is fastened to a support structure to secure and support the enclosure 600. Generally, an access door 612 (partially shown) is provided which hingedly couples to the trim panel 606 at a hinge 614. The access door may be selectively opened and closed to provide access to handles on the breakers 605.

The enclosure 600 receives utility power from primary conductors 616 which are typically introduced to the enclosure through one or more primary conduits 618. The conductors 616 provide single or multi-phase power to the individual circuit breakers 605 within the enclosure 600. A plurality of branch circuits 620 each typically having three conductors 621 (i.e., hot, neutral and ground or, alternatively, three-phase conductors) carry current from the circuit breakers 605 to remote locations (electrical sockets, light switches, appliances, etc.). The circuit breakers 605 are rated to "trip" or disconnect the branch conductors when the current draw of the particular circuit exceeds the rated breaker maximum (e.g., 15 or 20 amps).

Still referring to FIG. 7, a first aperture 622 is provided in the trim panel 606 and is adapted to receive the conduit apparatus 150. The apparatus, as generally described with reference to FIG. 2, is an open-sided box structure having one or more conduits 152 extending therethrough. Each conduit 152 is adapted to receive a conductor 616. The apparatus may also include a flange 154 having mounting holes 156 which mate with mounting holes 624 in the trim panel 606. Thus, the apparatus may be secured to the trim panel 606 with a fastener (not shown) or other mounting means. The conduit apparatus 150 further comprises the conduit enclosure 151 having surfaces 158 surrounding the conduits 152. When installed, the surfaces 158 cooperate to prevent access to the interior of the enclosure 600.

The trim panel, in one embodiment, is separable along a line 607 so that the a portion 606b of the trim panel 606 remains in place when a top portion 606a is removed. This allows access to the breakers through the upper portion 606a without disrupting the apparatus 150. The door 612 may be similarly split (see line 607d).

When the apparatus 150 is installed, the selected conductors 616 in the conduit 618 are separated and routed through the conduits 152. In one embodiment, three conduits are provided: one receives the first AC phase, the second receives the second AC phase, and the third receives the neutral conductor. The conductors 616 then couple to the circuit breakers 605 as in a conventional load center.

By providing the apparatus 150, a technician has convenient access for measuring the current draw of any branch circuit. To isolate and measure a particular circuit, the remaining circuits are deactivated or opened by switching the breakers 605 off, leaving only the suspect circuit live. The current measured at the corresponding conduit 152 is then representative of the current draw of the suspect circuit. Accordingly, any branch circuit can be accessed without entering the enclosure.

Referring still to FIGS. 7, the door 612 may cover the entire face of the enclosure 700 including the apparatus 150. In another embodiment, the enclosure is large such that the apparatus may be positioned and remain uncovered even when the door is closed. The latter permits even quicker coupling of the ammeter 162 to the conduits 152 (i.e., opening of the door 612 is not required).

Figure 8:
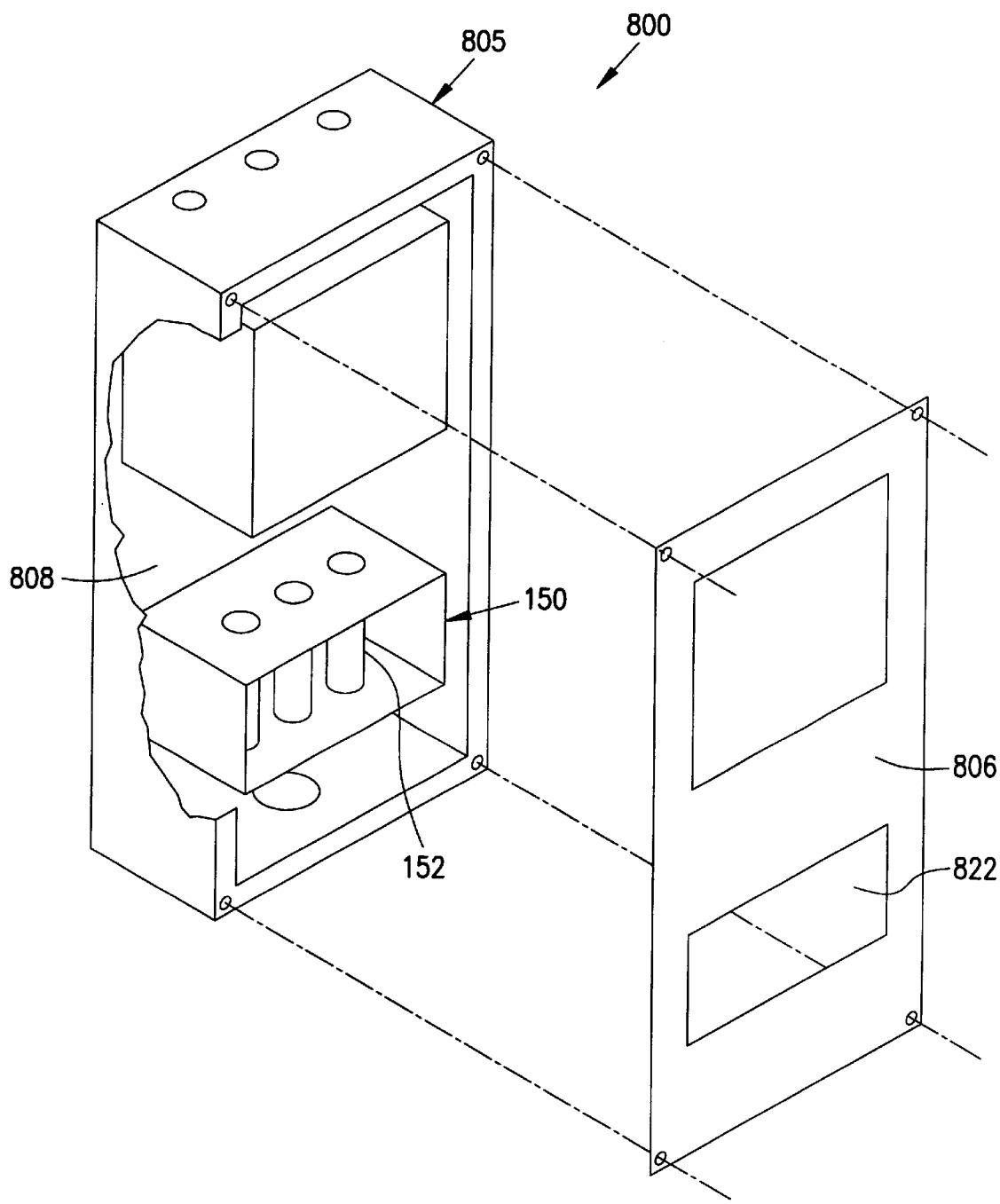
FIG. 8 is a partially cut-away view of an electrical enclosure showing a conduit apparatus in accordance with still yet another embodiment of the invention.

While the embodiment shown in FIGS. 7 utilizes a separate conduit apparatus having a flange 154 to couple to the trim panel 606, other methods of mounting the conduit apparatus 150 within the enclosure are also possible. For example, FIG. 8 shows an enclosure 800 utilizing another embodiment of the conduit apparatus 150 which secures to a back wall 808 (or, alternatively, the side, top or bottom walls) of the box 804 by conventional means (fastening, welding, etc.). In this instance, a trim panel aperture 822 would couple over the apparatus 150 so that the conduits 152 are accessible when the trim panel 806 is installed. This particular embodiment permits the trim panel to be easily removed without interference from the conduit enclosure. While shown without, the apparatus 150, in another embodiment, may include a flange which mates with the back side of the trim panel for additional support. Like the embodiment discussed above in FIG. 7, the enclosure 800 may also include a door (not shown).

While the load centers above are described in terms of the primary conductors (see 616 in FIG. 7) passing through the conduits 152, other embodiments in which various branch conductors 621 within the branch circuits (see 620 in FIG. 7) are routed through the conduits 152 are also possible within the scope of the invention.

Advantageously, the present invention provides an apparatus for use with an electrical enclosure which provides convenient access for current measurement of circuits within the enclosure. In particular, the apparatus provides adequate access for a hook-on ammeter without requiring entry into the enclosure itself. Any number of independent conductors may be measured simply by providing a corresponding conduit through which the conductor passes. Because entry into the enclosure is not required, the time required to complete the current measuring process is minimized. Furthermore, risk of electrical shock is also reduced as external measurement reduces or eliminates exposure to high voltage components.

Preferred embodiments of the present invention are described above. Those skilled in the art will recognize that many embodiments are possible within the scope of the invention. Variations, modifications, and combinations of the various parts and assemblies can certainly be made and still fall within the scope of the invention. Thus, the invention is limited only by the following claims, and equivalents thereto.

What is claimed is:

1. An insert apparatus for an openable electrical panel for enabling measurement of electrical current in selected conductors, the apparatus comprising:
   a conduit enclosure having at least three sides and at least one side having an opening therein; and
   at least one conduit extending from one of the at least three sides to another of the at least three sides, and extending through a portion of the conduit enclosure, such that the at least one conduit is accessible through the opening, wherein each conduit is adapted to receive a single electrical conductor therein.

2. The apparatus of claim 1 wherein the conduit enclosure further comprises mounting means for securing the conduit enclosure within an electrical enclosure.

3. The apparatus of claim 1 wherein the conduit enclosure further includes a plurality of surfaces defining an open-sided, box-like shape.

4. The apparatus of claim 1 further comprising at least a second conduit, wherein each conduit is adequately spaced apart from the other conduit and positioned with respect to the opening to provide sufficient space to each conduit to be surrounded by a portion of a hook-on ammeter.

5. The apparatus of claim 1 wherein the conduits are made of plastic.

6. The apparatus of claim 1 wherein the conduits are made of stainless steel.

7. The apparatus of claim 1 wherein the conduits are made of aluminum.

8. The apparatus of claim 1 wherein the insert apparatus further comprises a lip positioned near one of the sides of the conduit enclosure, the lip adapted to receive fasteners for mounting the conduit enclosure within an electrical panel.

9. An electrical enclosure comprising:
   a circuit panel box comprising a series of walls defining an interior and having one side that includes a first opening and a second opening, the box adapted to receive one or more electrical conductors;
   a circuit breaker;
   a panel which selectively covers the first opening to allow access to the circuit breaker but which prevents access to the electrical conductors; and
   an insert apparatus further comprising:
      a box having at least four sides, one of the sides having an open portion therein; and at least one conduit passing between two of the at least four sides and accessible from outside the insert, the conduit adapted to receive the electrical conductor therein, the insert fastened to the circuit panel box so that the at least one conduit is accessible from the exterior of the circuit panel box while preventing electrical access to elements within the circuit panel box.

10. The electrical enclosure of claim 9 wherein the insert extends into the interior of the box.

11. The electrical enclosure of claim 9 wherein the insert is coupled to the box to allow access to the conduit from the same surface as the circuit breaker.

12. The electrical enclosure of claim 11 wherein the electrical enclosure includes a cover for covering the circuit breaker and the insert.

13. An electrical enclosure comprising:
   a box comprising a series of walls defining an interior and having an open side;
   one or more electrical components mounted within the box;
   an insert for isolating selected conductors within the electrical enclosure comprising:
     a container having an open portion;
     at least one hollow conduit attached to the sides of the container and providing passage through the container, the conduit carrying a selected electrical conductor, which is accessible from outside the electrical enclosure but electrically isolated from the interior of the box;
   a panel for selectively covering the open side.

14. The electrical enclosure of claim 13 wherein the insert is coupled to the box.

15. The electrical enclosure of claim 13 wherein the insert is coupled to the panel.

16. The electrical enclosure of claim 13, wherein the panel has a first aperture providing access to the insert.

17. The electrical enclosure of claim 16 wherein the electrical components are fuse elements.

18. The electrical enclosure of claim 17 wherein the panel includes a second aperture adapted to permit access to the fuse elements.

19. The electrical enclosure of claim 18 further comprising a door which selectively covers the first or the second aperture.

20. A method of measuring current in a conductor contained within a closed electrical enclosure, the method comprising:
   providing an electrical enclosure having an insert with a conduit that carries a selected conductor, the insert positioned within the electrical enclosure so that access to the conduit is available from a position outside of the electrical enclosure, the insert preventing access to electrical energy flowing within the electrical enclosure;
   placing a hook-on ammeter around the conduit; and
   measuring the current in the selected conductor with the ammeter without having to open the electrical enclosure.

* * * * *